(12) United States Patent
Harada et al.

(10) Patent No.: US 9,856,583 B2
(45) Date of Patent: Jan. 2, 2018

(54) METHOD OF MANUFACTURING SILICON CARBIDE SINGLE CRYSTAL

(71) Applicant: SUMITOMO ELECTRIC INDUSTRIES, LTD., Osaka-shi, Osaka (JP)

(72) Inventors: Shin Harada, Itami (JP); Tsutomu Hori, Itami (JP)

(73) Assignee: SUMITOMO ELECTRIC INDUSTRIES, LTD., Osaka-shi, Osaka (JP)

(*) Notice: Subject to any disclaimer, the term of this patent is extended or adjusted under 35 U.S.C. 154(b) by 177 days.

(21) Appl. No.: 14/817,662

(22) Filed: Aug. 4, 2015

(65) Prior Publication Data
US 2016/0138187 A1 May 19, 2016

(30) Foreign Application Priority Data
Nov. 18, 2014 (JP) ................. 2014-233764

(51) Int. Cl.
C30B 29/36 (2006.01)
C30B 23/06 (2006.01)
C30B 35/00 (2006.01)

(52) U.S. Cl.
CPC .............. C30B 29/36 (2013.01); C30B 23/06 (2013.01); C30B 35/002 (2013.01)

(58) Field of Classification Search
CPC combination set(s) only.
See application file for complete search history.

(56) References Cited

U.S. PATENT DOCUMENTS

2006/0254505 A1* 11/2006 Tsvetkov ................ C30B 23/00 117/104
2009/0205565 A1* 8/2009 Nakabayashi .......... C30B 23/00 117/217

FOREIGN PATENT DOCUMENTS

JP 2012-510951 A 5/2012
WO WO-2010/077639 A2 7/2010

* cited by examiner

*Primary Examiner* — Duy Deo
*Assistant Examiner* — Erin Bergner
(74) *Attorney, Agent, or Firm* — Drinker Biddle & Reath LLP

(57) ABSTRACT

A method of manufacturing a silicon carbide single crystal includes steps of preparing a crucible, a source material disposed toward a bottom surface in the crucible, a seed crystal disposed to face the source material toward a top surface in the crucible, a resistive heater, and a heat insulator configured to be able to accommodate the crucible therein, measuring a mass of at least a portion of the heat insulator, comparing a measured value of the mass obtained in the measuring step with a threshold value, and growing a silicon carbide single crystal on the seed crystal by sublimation of the source material by heating the crucible placed in the heat insulator with the resistive heater. When the measured value of the mass is lower than the threshold value in the comparing step, the step of growing a silicon carbide single crystal is performed at least one or more times.

8 Claims, 12 Drawing Sheets

METHOD OF MANUFACTURING SILICON CARBIDE SINGLE CRYSTAL

BACKGROUND OF THE INVENTION

Field of the Invention

The present disclosure relates to methods of manufacturing silicon carbide single crystals.

Description of the Background Art

In recent years, silicon carbide has been increasingly employed as a material for a semiconductor device in order to allow a higher breakdown voltage, lower loss and the like of the semiconductor device.

Japanese National Patent Publication No. 2012-510951 describes a method of manufacturing a silicon carbide single crystal by sublimation using a crucible made of graphite.

SUMMARY OF THE INVENTION

A method of manufacturing a silicon carbide single crystal according to the present disclosure is a manufacturing method of growing a silicon carbide single crystal by sublimation, and includes steps of preparing a crucible having a top surface, a bottom surface opposite to the top surface, and a tubular side surface located between the top surface and the bottom surface, a source material disposed toward the bottom surface in the crucible, a seed crystal disposed to face the source material toward the top surface in the crucible, a heater for heating the crucible, and a heat insulator configured to be able to accommodate the crucible therein, measuring a mass of at least a portion of the heat insulator, comparing a measured value of the mass obtained in the measuring step with a threshold value, and growing a silicon carbide single crystal on the seed crystal by sublimation of the source material by heating the crucible placed in the heat insulator with the heater. When the measured value of the mass is lower than the threshold value in the comparing step, the step of growing a silicon carbide single crystal is performed at least one or more times.

DETAILED DESCRIPTION OF THE INVENTION

Description of Embodiments

Figure 1:
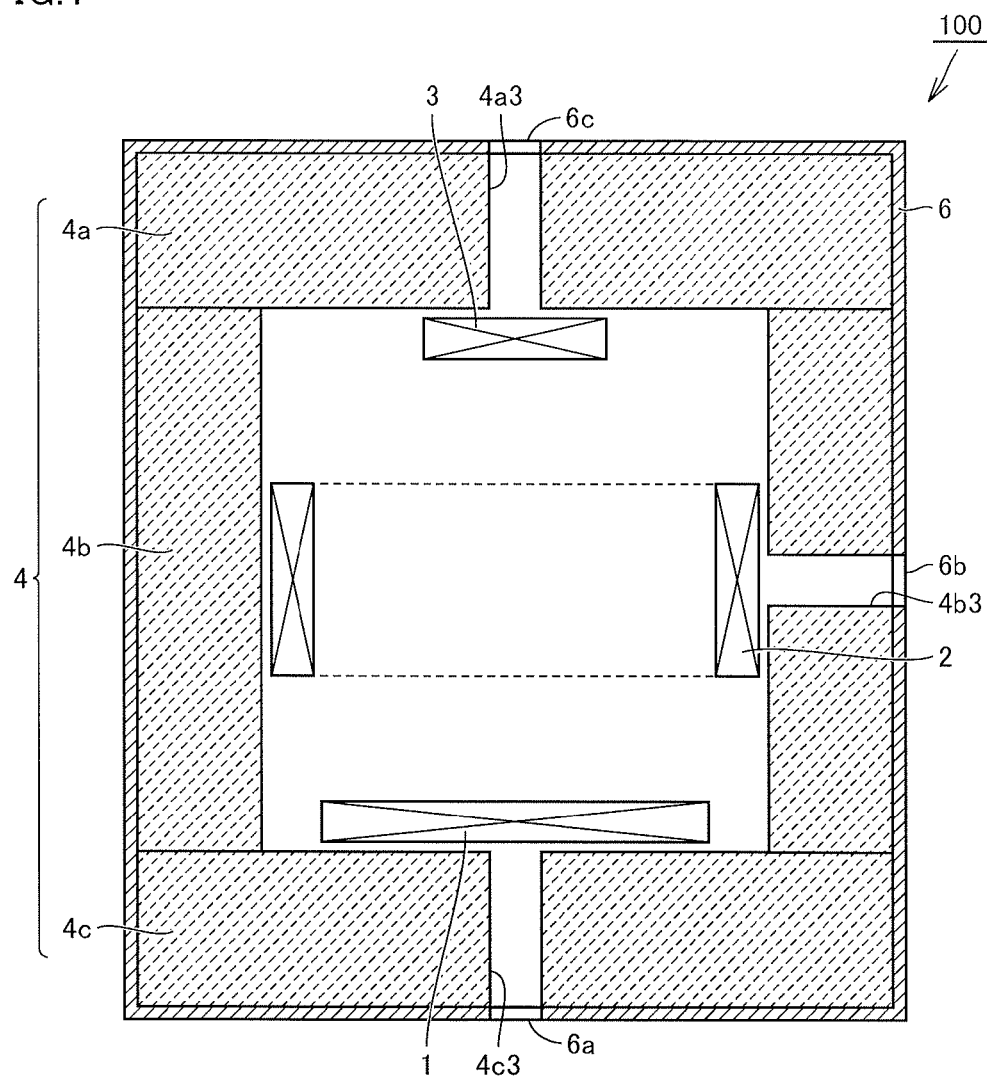
FIG. 1 is a schematic vertical sectional view showing the configuration of an apparatus of manufacturing a silicon carbide single crystal according to a first embodiment.

During growth of a silicon carbide single crystal, a source material gas which has been diffused outward from inside a crucible may be recrystallized in a heat insulator. Accumulation of the recrystallized silicon carbide in the heat insulator may result in degradation in heat insulation performance of the heat insulator. In order to maintain the crystalline quality of the silicon carbide single crystal, it is required that a time to replace the heat insulator can be determined by detection of a degraded state of the heat insulator.

In sublimation, generally, with a silicon carbide source material and a seed crystal placed in a crucible and with a heat insulator disposed to surround the circumference of the crucible, a source material gas is generated by sublimation of the silicon carbide source material. The sublimated source material gas is recrystallized on a surface of the seed crystal, whereby a silicon carbide single crystal is grown on the surface of the seed crystal.

During the growth of the silicon carbide single crystal, a temperature inside the crucible is high for the sublimation of silicon carbide, whereas a temperature outside the crucible is lower than the inside temperature. Graphite forming the heat insulator surrounding the outer circumference of the crucible is porous. Thus, the source material gas which has been diffused outward from inside the crucible may enter the heat insulator and be recrystallized in a portion having a temperature at which silicon carbide is recrystallized. Accumulation of the recrystallized silicon carbide in the heat insulator causes increase in thermal conductivity of the heat insulator due to the accumulated silicon carbide, which may result in degradation in heat insulation performance of the heat insulator.

Embodiments will be initially listed and described.

(1) A method of manufacturing a silicon carbide single crystal according to the present disclosure is a manufacturing method of growing a silicon carbide single crystal by sublimation, and includes steps of preparing a crucible having a top surface, a bottom surface opposite to the top surface, and a tubular side surface located between the top surface and the bottom surface, a source material disposed toward the bottom surface in the crucible, a seed crystal disposed to face the source material toward the top surface in the crucible, a heater for heating the crucible, and a heat insulator configured to be able to accommodate the crucible therein, measuring a mass of at least a portion of the heat insulator, comparing a measured value of the mass obtained in the measuring step with a threshold value, and growing a silicon carbide single crystal on the seed crystal by sublimation of the source material by heating the crucible placed in the heat insulator with the heater. When the measured value of the mass is lower than the threshold value in the comparing step, the step of growing a silicon carbide single crystal is performed at least one or more times.

Increase in thermal conductivity of the heat insulator leads to a wider temperature distribution on a surface of the seed crystal as the seed crystal increases in temperature, and thus may result in a wider in-plane distribution of crystalline quality of the silicon carbide single crystal grown on the surface of the seed crystal. In order to reduce the in-plane distribution of crystalline quality, therefore, it is required that a time to replace the heat insulator can be determined by detection of a degraded state of the heat insulator.

The present inventors found that there is a correlation between the thermal conductivity of a heat insulator and the mass of the heat insulator. Based on this finding, in the embodiments of the present disclosure, the mass of a heat insulator is employed as an indicator value for a degraded state of the heat insulator. Thus, the mass of a heat insulator is measured, and a time to replace the heat insulator can be determined based on a measured value of the mass.

(2) Preferably, the method of manufacturing a silicon carbide single crystal according to (1) above further includes a step of, when the measured value of the mass is equal to or higher than the threshold value in the comparing step, replacing the heat insulator with another heat insulator whose measured value of mass is lower than the threshold value. After the replacing step, the step of growing a silicon carbide single crystal is performed.

(3) Preferably, in the method of manufacturing a silicon carbide single crystal according to (2) above, the heat insulator includes a first heat insulating unit provided to cover the top surface, a second heat insulating unit provided to cover the side surface, and a third heat insulating unit provided to cover the bottom surface, the first to third heat insulating units being separable from each other. In the measuring step, the at least a portion of the heat insulator includes the first heat insulating unit. Thus, even if the heat insulator increases in size and weight as the crucible has a larger diameter, a portion of the heat insulator can be removed and the mass of the portion can be measured. Further, the first heat insulating unit, which has a temperature at which recrystallization of silicon carbide tends to be occur as compared to the second heat insulating unit and the third heat insulating unit, is a portion where the mass increases significantly relative to increase in the number of times of crystal growth. By measuring the mass of the first heat insulating unit where degradation manifests itself most conspicuously, a degraded state of the heat insulator can be more accurately detected, whereby the accuracy of determining a time for replacement can be improved.

(4) Preferably, in the method of manufacturing a silicon carbide single crystal according to (3) above, the second heat insulating unit includes a plurality of heat insulating portions provided between the first heat insulating unit and the third heat insulating unit and arranged such that they can be separated from each other. In the measuring step, the at least a portion of the heat insulator includes one of the heat insulating portions directly connected to the first heat insulating unit. By subdividing the second heat insulating unit in this manner, the heat insulator can be more readily handled and the scope of selection of a portion for mass measurement can be expanded. Further, since the heat insulating portion connected to the first heat insulating unit is a portion where recrystallization of silicon carbide tends to be occur after the first heat insulating unit, a time for replacement can be accurately determined also by measuring the masses of the first heat insulating unit and the heat insulating portion.

(5) Preferably, in the method of manufacturing a silicon carbide single crystal according to (2) above, the heat insulator includes a first heat insulating unit provided to cover the top surface, a second heat insulating unit provided to cover the side surface, and a third heat insulating unit provided to cover the bottom surface, the first to third heat insulating units being separable from each other. In the measuring step, a mass of a portion removed from one of the first heat insulating unit, the second heat insulating unit and the third heat insulating unit is measured. Thus, a portion of one of the heat insulating units can be removed and the mass of the portion can be measured. Considering the accuracy of determining a time for replacement, it is preferable to measure the mass of a portion removed from the first heat insulating unit where recrystallization of silicon carbide tends to be occur. When measuring the weight of a portion of the second heat insulating unit, it is preferable to remove a portion located toward the top surface of the crucible.

(6) Preferably, in the method of manufacturing a silicon carbide single crystal according to (1) above, the heat insulator includes a first heat insulating unit provided to cover the top surface, a second heat insulating unit provided to cover the side surface, and a third heat insulating unit provided to cover the bottom surface, the first to third heat insulating units being separable from each other. In the measuring step, the at least a portion of the heat insulator includes the first heat insulating unit. Thus, even if the heat insulator increases in size and weight as the crucible has a larger diameter, a portion of the heat insulator can be removed and the mass of the portion can be measured. Further, the first heat insulating unit, which has a temperature at which recrystallization of silicon carbide tends to be occur as compared to the second heat insulating unit and the third heat insulating unit, is a portion where the mass increases significantly relative to increase in the number of times of crystal growth. By measuring the mass of the first heat insulating unit where degradation manifests itself most conspicuously, a degraded state of the heat insulator can be more accurately detected, whereby the accuracy of determining a time for replacement can be improved.

(7) Preferably, in the method of manufacturing a silicon carbide single crystal according to (6) above, the second heat insulating unit includes a plurality of heat insulating portions provided between the first heat insulating unit and the third heat insulating unit and arranged such that they can be separated from each other. In the measuring step, the at least a portion of the heat insulator includes one of the heat insulating portions directly connected to the first heat insulating unit. By subdividing the second heat insulating unit in this manner, the heat insulator can be more readily handled and the scope of selection of a portion for mass measurement can be expanded. Further, since the heat insulating portion directly connected to the first heat insulating unit is a portion where recrystallization of silicon carbide tends to be occur after the first heat insulating unit, a time for replacement can be accurately determined also by measuring the masses of the first heat insulating unit and the heat insulating portion.

(8) Preferably, in the method of manufacturing a silicon carbide single crystal according to (1) above, the heat insulator includes a first heat insulating unit provided to cover the top surface, a second heat insulating unit provided to cover the side surface, and a third heat insulating unit provided to cover the bottom surface, the first to third heat insulating units being separable from each other. In the measuring step, a mass of a portion removed from one of the first heat insulating unit, the second heat insulating unit and the third heat insulating unit is measured. Thus, a portion of one of the heat insulating units can be removed and the mass of the portion can be measured. Considering the accuracy of determining a time for replacement, it is preferable to measure the mass of a portion removed from the first heat insulating unit where recrystallization of silicon carbide tends to be occur. When measuring the weight of a portion of the second heat insulating unit, it is preferable to remove a portion located toward the top surface of the crucible.

(9) An apparatus of manufacturing a silicon carbide single crystal according to the present disclosure includes a heat insulator configured to be able to accommodate a crucible therein, a heater provided inside or outside the heat insulator so as to surround a circumference of the crucible, and a chamber configured to be able to accommodate at least the heat insulator. The crucible has a top surface, a bottom surface opposite to the top surface, and a tubular side surface located between the top surface and the bottom surface. The heat insulator includes a first heat insulating unit provided to cover the top surface, a second heat insulating unit provided to cover the side surface, and a third heat insulating unit provided to cover the bottom surface, the first to third heat insulating units being separable from each other. Thus, even if the heat insulator increases in size and weight as the crucible has a larger diameter, the heat insulator can be readily handled. By removing a portion of the heat insulator and measuring the mass of the portion, therefore, a degraded state of the heat insulator can be detected to determine a time for replacement.

(10) Preferably, in the apparatus of manufacturing a silicon carbide single crystal according to (9) above, the second heat insulating unit includes a plurality of heat insulating portions provided between the first heat insulating unit and the third heat insulating unit and arranged such that they can be separated from each other. By subdividing the second heat insulating unit in this manner, the heat insulator can be more readily handled and the scope of selection of a portion for mass measurement can be expanded.

Details of Embodiments

Specific examples of the embodiments will be described below with reference to the drawings. In the following drawings, the same or corresponding parts are designated by the same reference signs and description thereof will not be repeated. In the present specification, an individual plane and a group plane are shown in ( ) and { }, respectively. Although a crystallographically negative index is normally expressed by a number with a bar "-" thereabove, a negative sign herein precedes a number to indicate a crystallographically negative index.

First Embodiment

Configuration of Apparatus of Manufacturing Silicon Carbide Single Crystal

First, the configuration of an apparatus 100 of manufacturing a silicon carbide single crystal according to a first embodiment is described.

As shown in FIG. 1, apparatus 100 of manufacturing a silicon carbide single crystal according to the first embodiment is an apparatus for manufacturing a silicon carbide single crystal by sublimation, and mainly includes a chamber 6, a heat insulator 4, a first resistive heater 1, a second resistive heater 2, and a third resistive heater 3.

Figure 2:
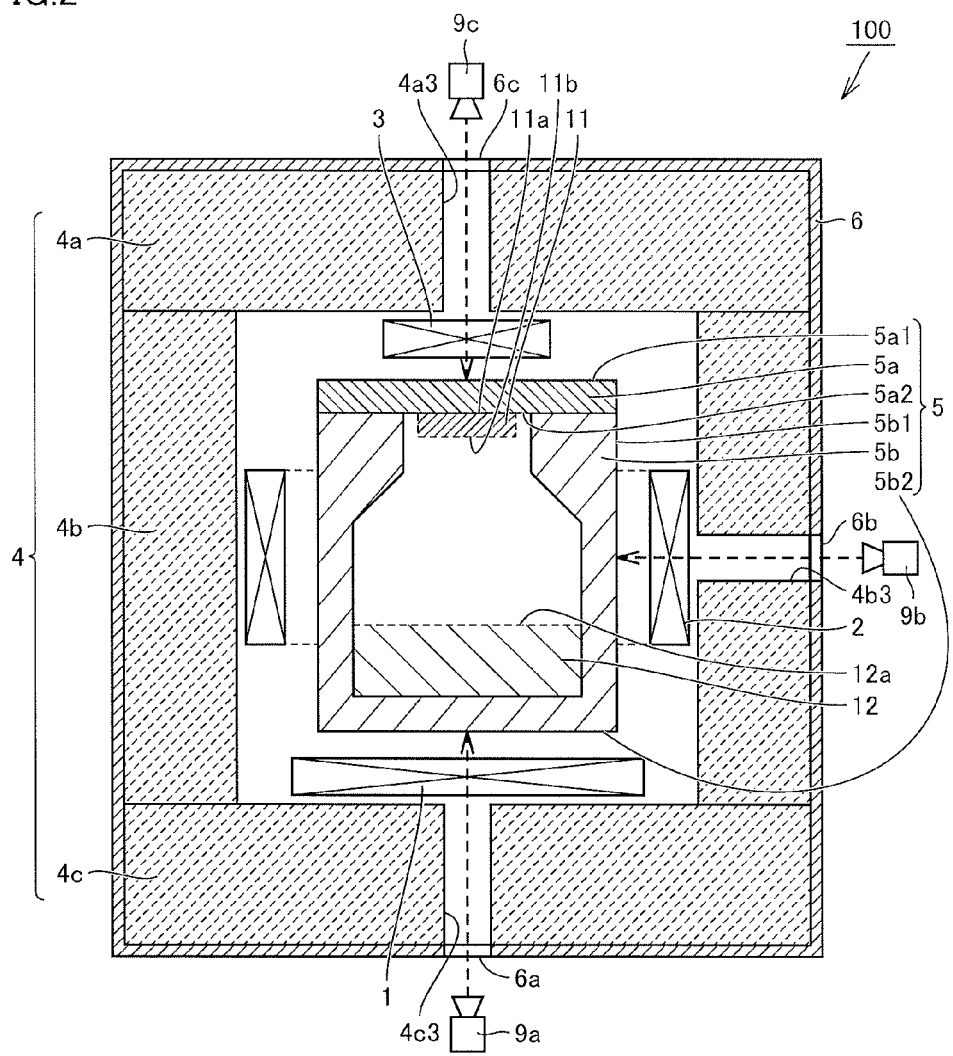
FIG. 2 is a schematic vertical sectional view showing the configuration of the apparatus of manufacturing a silicon carbide single crystal according to the first embodiment, with a crucible and radiation thermometers disposed.

Heat insulator 4 is configured to be able to accommodate a crucible (not shown). Heat insulator 4 is made of graphite, for example, and is a graphite felt, a molded heat insulator made of graphite, or a graphite sheet. The molded heat insulator means, for example, sintered graphite felts which are stacked and bonded together with an adhesive. As shown in FIG. 2, heat insulator 4 is provided to surround the circumference of a crucible 5 when crucible 5 is placed in chamber 6.

As shown in FIG. 2, apparatus 100 of manufacturing a silicon carbide single crystal further includes crucible 5, a lower radiation thermometer 9a, a lateral radiation thermometer 9b, and an upper radiation thermometer 9c.

Crucible 5 is made of graphite, for example, and has a top surface 5a1, a bottom surface 5b2 opposite to top surface 5a1, and a tubular side surface 5b1 located between top surface 5a1 and bottom surface 5b2. Side surface 5b1 has a cylindrical shape, for example. Crucible 5 has a pedestal 5a configured to be able to hold a seed crystal 11, and an accommodation unit 5b configured to be able to accommodate a silicon carbide source material 12. Pedestal 5a has a seed crystal holding surface 5a2 in contact with a backside surface 11a of seed crystal 11, and top surface 5a1 opposite to seed crystal holding surface 5a2. Pedestal 5a forms top surface 5a1. Accommodation unit 5b forms bottom surface 5b2. Side surface 5b1 is formed of pedestal 5a and accommodation unit 5b. In crucible 5, a silicon carbide single crystal is grown on a surface 11b of seed crystal 11 by sublimation of silicon carbide source material 12 and recrystallization of the source material on surface 11b of seed crystal 11. That is, a silicon carbide single crystal can be manufactured by sublimation.

First resistive heater 1, second resistive heater 2 and third resistive heater 3 are disposed outside crucible 5, and form a heater for heating crucible 5. If a resistance heating heater is used for the heater, the heater is preferably disposed between crucible 5 and heat insulator 4 as shown in FIG. 2. First resistive heater 1, second resistive heater 2 and third resistive heater 3 are configured such that amounts of heat generated by theses heaters can be controlled independently of one another by controlling electric power supplied to each of these heaters. In other words, the heater is configured to be able to adjust temperatures of top surface 5a1, side surface 5b1 and bottom surface 5b2 independently of one another.

First resistive heater 1 is provided to face bottom surface 5b2. First resistive heater 1 is distant from bottom surface 5b2. Second resistive heater 2 is arranged to surround side surface 5b1. Second resistive heater 2 is distant from side surface 5b1. Third resistive heater 3 is provided to face top surface 5a1. Third resistive heater 3 is distant from top surface 5a1.

Figure 3:
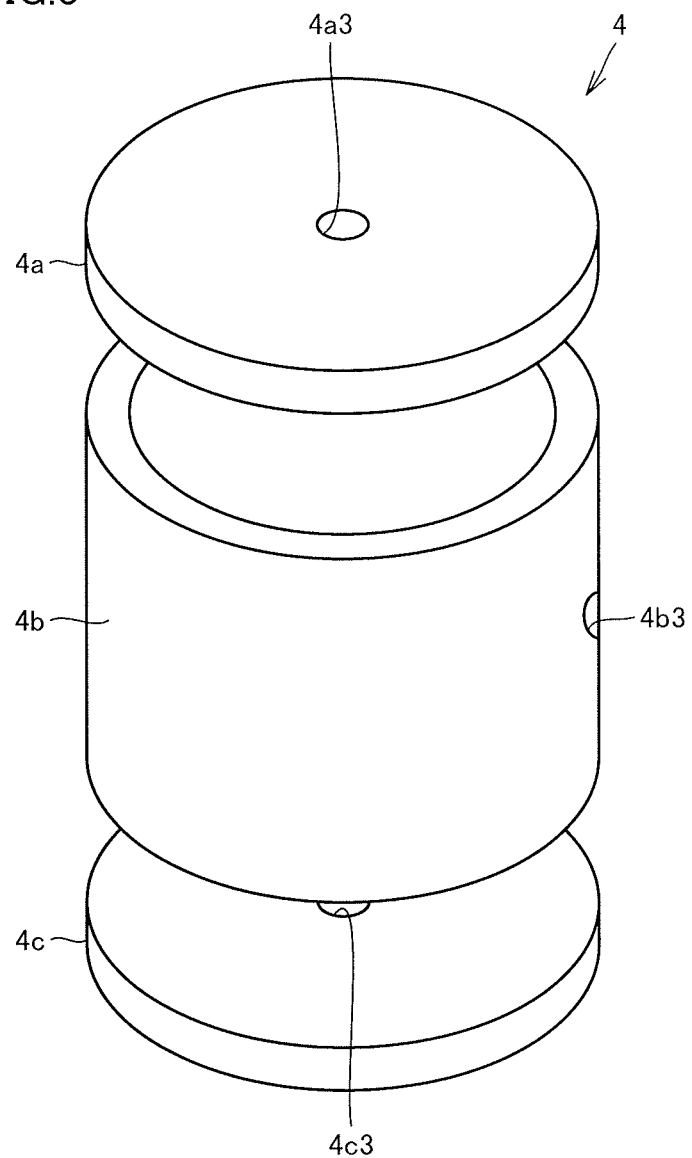
FIG. 3 is a schematic perspective view showing the configuration of a heat insulator.

As shown in FIGS. 2 and 3, heat insulator 4 includes a first heat insulating unit 4a, a second heat insulating unit 4b, and a third heat insulating unit 4c. First to third heat insulating units 4a to 4c can be separated from each other. First heat insulating unit 4a is provided to cover top surface 5a1. Second heat insulating unit 4b is provided to cover side surface 5b1. Third heat insulating unit 4c is provided to cover bottom surface 5b2. Second heat insulating unit 4b has a cylindrical shape, for example.

First heat insulating unit 4a is provided with an opening 4a3 in a position facing third resistive heater 3. Chamber 6 is provided with an opening 6c in communication with opening 4a3. Second heat insulating unit 4b is provided with an opening 4b3 in a position facing second resistive heater 2. Chamber 6 is provided with an opening 6b in communication with opening 4b3. Third heat insulating unit 4c is provided with an opening 4c3 in a position facing first resistive heater 1. Chamber 6 is provided with an opening 6a in communication with opening 4c3.

As shown in FIG. 2, lower radiation thermometer 9a is provided outside chamber 6 in a position facing bottom surface 5b2, and configured to be able to measure a temperature of bottom surface 5b2 through opening 4c3 and opening 6a. Lower radiation thermometer 9a is provided in a position facing first resistive heater 1, and may be configured to be able to measure a temperature of first resistive heater 1 through opening 4c3 and opening 6a.

Lateral radiation thermometer 9b is provided outside chamber 6 in a position facing side surface 5b1, and configured to be able to measure a temperature of side surface 5b1 through opening 4b3 and opening 6b. Lateral radiation thermometer 9b is provided in a position facing second resistive heater 2, and may be configured to be able to measure a temperature of second resistive heater 2 through opening 4b3 and opening 6b.

Upper radiation thermometer 9c is provided outside chamber 6 in a position facing top surface 5a1, and configured to be able to measure a temperature of top surface 5a1 through opening 4a3 and opening 6c. Upper radiation thermometer 9c is provided in a position facing third resistive heater 3, and may be configured to be able to measure a temperature of third resistive heater 3 through opening 4a3 and opening 6c.

A pyrometer manufactured by CHINO Corporation (model number: IR-CAH8TN6) can be used, for example, as radiation thermometers 9a to 9c. The pyrometer has measurement wavelengths of 1.55 µm and 0.9 µm, for example. The pyrometer has a set value for emissivity of 0.9, for example. The pyrometer has a distance coefficient of 300, for example. A measurement diameter of the pyrometer is determined by dividing a measurement distance by the distance coefficient. If the measurement distance is 900 mm, for example, the measurement diameter is 3 mm. An opening diameter of each of openings 4a3 to 4c3 and openings 6a to 6c is equal to or grater than the measurement diameter of the pyrometer, and is, for example, 3 to 5 mm.

<Method of Manufacturing Silicon Carbide Single Crystal>

Next, a method of manufacturing a silicon carbide single crystal according to the first embodiment is described.

The method of manufacturing a silicon carbide single crystal according to the first embodiment includes a step of determining a time to replace heat insulator 4 by detecting a degraded state of heat insulator 4. First, a summary of the step of determining a time to replace heat insulator 4 is described.

Figure 4:
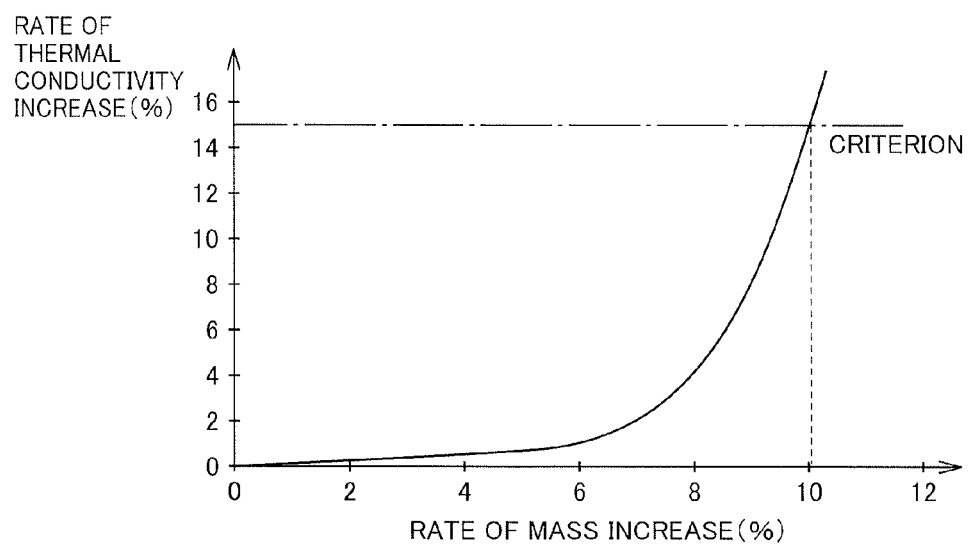
FIG. 4 is a diagram showing relation between thermal conductivity and mass of the heat insulator.

A method of detecting a degraded state of heat insulator 4 is described with reference to FIG. 4. FIG. 4 is a diagram showing relation between thermal conductivity and mass of heat insulator 4. A vertical axis in FIG. 4 represents a rate of thermal conductivity increase (unit: %) of heat insulator 4, and a horizontal axis represents a rate of mass increase (unit: %) of heat insulator 4.

Figure 5:
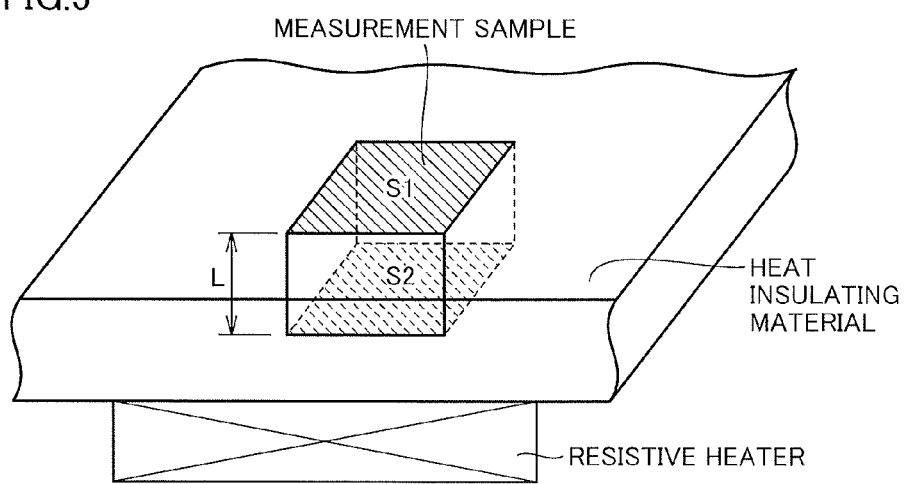
FIG. 5 is a diagram illustrating a method of measuring the thermal conductivity of the heat insulator.

The thermal conductivity of heat insulator 4 can be measured by detecting a temperature difference that occurs between opposite surfaces of a measurement sample when a resistive heater is operated, as shown in FIG. 5. Specifically, the circumference of a measurement sample which has been cut out from heat insulator 4 is enclosed with a heat insulating material in all directions, with a resistive heater disposed to face one measurement surface S1 of the measurement sample. When the resistive heater is operated, a temperature difference occurs between measurement surface S1 and a measurement surface S2 opposite to measurement surface S1 Assuming that a temperature of measurement surface S1 is T1 (K) and a temperature of measurement surface S2 is T2 (K), then a temperature difference between them is expressed as T2-T1 (K).

Assuming that a thickness of the measurement sample is L (m), an area of measurement surfaces S1 and S2 is S ($m^2$), and an amount of heat generated by the resistive heater is A ($W/m^2$), then thermal conductivity κ (W/mK) of the measurement sample is expressed by the following equation (1):

$$\kappa = AL/S(T2-T1) \tag{1}$$

The "rate of thermal conductivity increase" indicates a ratio of the magnitude of thermal conductivity which has increased due to degradation of heat insulator 4 to the magnitude of initial thermal conductivity before the degradation (for example, at a time when heat insulator 4 is new). In the first embodiment, initial thermal conductivity κ0 before the degradation of heat insulator 4 was measured with the above measurement method. A measured value of thermal conductivity κ0 was, for example, about 0.3 to 0.5 (W/mK). Further, thermal conductivity κn after crystal growth was performed n times using heat insulator 4 was measured. The measured values of thermal conductivities κ0 and κn were then substituted into the following equation (2) to calculate a rate of thermal conductivity increase Δκ:

$$\Delta\kappa = (\kappa n - \kappa 0)/\kappa 0 \tag{2}$$

When thermal conductivities κ0 and κn are equal, the rate of thermal conductivity increase is 0%. The higher the rate of thermal conductivity increase, the higher the thermal conductivity and the further progressed the degradation of heat insulator 4.

Looking back at FIG. 4, the "rate of mass increase" indicates a ratio of the magnitude of mass which has increased due to degradation of heat insulator 4 to the magnitude of initial mass before the degradation. In the first embodiment, an initial mass M0 was measured, and a mass Mn after crystal growth was performed n times using heat insulator 4 was measured. The measured values of masses M0 and Mn were then substituted into the following equation (3) to calculate a rate of mass increase ΔM:

$$\Delta M = (Mn - M0)/M0 \tag{3}$$

When masses M0 and Mn are equal, the rate of mass increase is 0%. The higher the rate of mass increase, the higher the mass of heat insulator 4. As shown in FIG. 4, as the degradation of heat insulator 4 progresses and the rate of increase in thermal conductivity increases, the rate of increase in mass also increases. This is because the sublimated source material gas is diffused out of crucible 5, and the silicon carbide recrystallized in heat insulator 4 causes increase in thermal conductivity of heat insulator 4 as well as increase in mass of heat insulator 4.

The present inventors thus found that there is a correlation between the thermal conductivity and the mass of heat insulator 4. In the method of manufacturing a silicon carbide single crystal according to the first embodiment, therefore, the mass of heat insulator 4 is used as a new indicator for determining a time to replace heat insulator 4. In other words, a time to replace heat insulator 4 is determined by measuring the mass of heat insulator 4 and detecting a degraded state of heat insulator 4 based on a measured value of the mass. As an example, if a time when the rate of thermal conductivity increase reaches 15% is set as the time to replace heat insulator 4, as shown in FIG. 4, a rate of mass increase of 10% corresponding to the rate of thermal conductivity increase of 15% is set as a criterion for the time for replacement.

As shown in FIG. 3, in manufacturing apparatus 100 according to the first embodiment, heat insulator 4 is formed of the plurality of heat insulating units 4a to 4c which can be separated from each other. Thus, when measuring the mass of heat insulator 4, the mass of at least a portion of heat insulator 4 can be measured.

When crucible 5 has a larger diameter as the silicon carbide single crystal has a larger diameter, heat insulator 4 surrounding the outer circumference of crucible 5 increases in size and mass, which may result in difficulty in handling of heat insulator 4. According to manufacturing apparatus 100 of the first embodiment, even if heat insulator 4 increases in size and weight, a portion of heat insulator 4 can be removed and the mass of the portion can be measured. Therefore, a time to replace heat insulator 4 can be readily determined regardless of the size and weight of heat insulator 4.

The "at least a portion of heat insulator 4" whose mass is measured can be at least one of first heat insulating unit 4a, second heat insulating unit 4b and third heat insulating unit 4c, but preferably includes first heat insulating unit 4a. The reason for this is described below.

Figure 6:
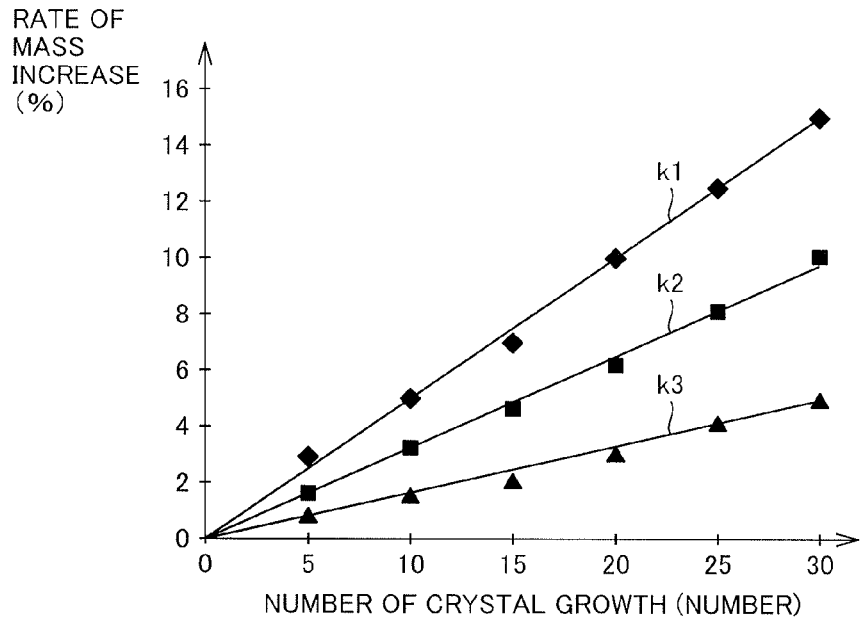
FIG. 6 is a diagram showing an example of change in rate of mass increase in heat insulating units.

FIG. 6 is a diagram showing an example of change in rate of mass increase in each of the heat insulating units forming heat insulator 4. A horizontal axis in FIG. 6 represents the number of times the growth of a silicon carbide single crystal is repeated using the same heat insulator 4 (number of crystal growth), and a vertical axis represents a rate of mass increase of heat insulating units 4a to 4c of heat insulator 4. It is noted that the rate of mass increase of the heat insulating unit indicates a ratio of the magnitude of mass of the heat insulating unit which has increased due to degradation to the magnitude of initial mass of the heat insulating unit.

In FIG. 6, a straight line k1 indicates relation between a rate of mass increase of first heat insulating unit 4a and the number of crystal growth, a straight line k2 indicates relation between a rate of mass increase of second heat insulating unit 4b and the number of crystal growth, and a straight line k3 indicates relation between a rate of mass increase of third heat insulating unit 4c and the number of crystal growth. Each of straight lines k1 to k3 is obtained by measuring the mass of each heat insulating unit once every five times the silicon carbide single crystal is grown to calculate a rate of mass increase, and performing straight-line approximation of the calculated result for each heat insulating unit.

As shown in FIG. 6, straight line k1 has the greatest inclination and straight line k3 has the smallest inclination. This shows that first heat insulating unit 4a has the highest rate of mass increase and third heat insulating unit 4c has the lowest rate of mass increase relative to increase in the number of crystal growth. As shown in FIG. 2, first heat insulating unit 4a is disposed in a position facing top surface 5a1, and third heat insulating unit 4c is disposed in a position facing bottom surface 5b2. It is thus understood that the degradation progresses further in first heat insulating unit 4a disposed toward top surface 5a1 than in third heat insulating unit 4c disposed toward bottom surface 5b2.

When growing a silicon carbide single crystal by sublimation, crucible 5 is heated so as to cause the sublimation of silicon carbide source material 12 and the recrystallization of the source material on surface 11b of seed crystal 11. Specifically, the temperature of silicon carbide source material 12 is maintained at a temperature at which silicon carbide is sublimated, and the temperature of seed crystal 11 is maintained at a temperature lower than the temperature of silicon carbide source material 12 and at which silicon carbide is recrystallized. With this temperature difference, a temperature gradient required for sublimation is formed between silicon carbide source material 12 and seed crystal 11.

In order to control the temperature gradient, the temperatures of top surface 5a1, side surface 5b1 and bottom surface 5b2 are adjusted with resistive heaters 1 to 3. Thus, the temperature gradient also exists in crucible 5 where the temperature decreases in a direction from bottom surface 5b2 toward top surface 5a1. That is, bottom surface 5b2 has a temperature at which silicon carbide is sublimated, whereas top surface 5a1 has a temperature at which silicon carbide is recrystallized. Consequently, when the sublimated source material gas is diffused out of crucible 5, the source material gas tends to be recrystallized in first heat insulating unit 4a disposed to face top surface 5a1. Then, the recrystallized silicon carbide remains in heat insulating unit 4a, whereby heat insulating unit 4a has a higher rate of mass increase than second heat insulating unit 4b and third heat insulating unit 4c. In a reflection of the temperature gradient in crucible 5, second heat insulating unit 4b has the second highest rate of mass increase, and third heat insulating unit 4c has the lowest rate of mass increase.

In the first embodiment, by measuring the mass of first heat insulating unit 4a where degradation manifests itself most conspicuously of the plurality of heat insulating units 4a to 4c, a degraded state of heat insulator 4 can be more accurately detected. Accordingly, a time to replace heat insulator 4 can be more accurately determined.

Figure 7:
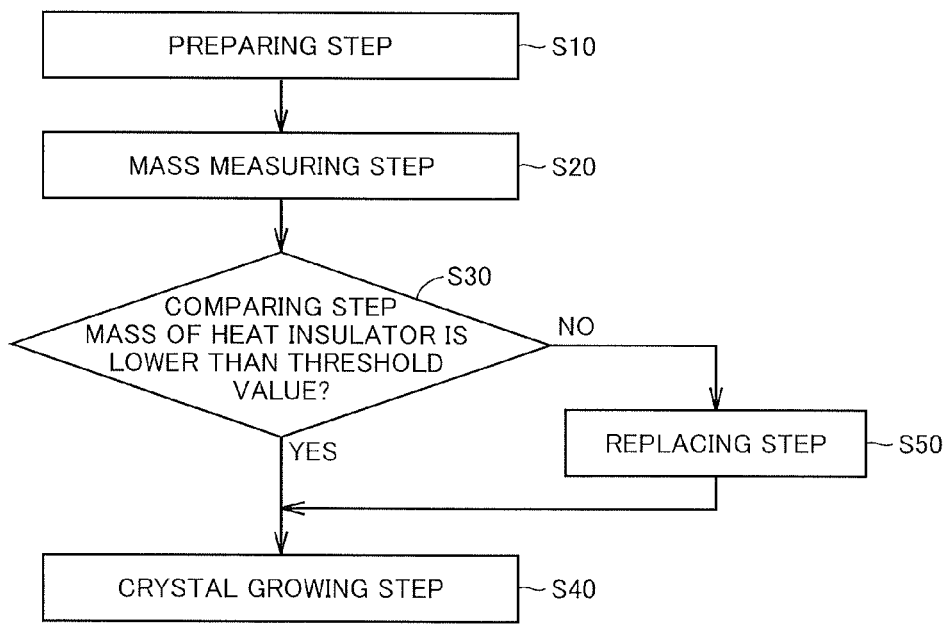
FIG. 7 is a flowchart showing a method of manufacturing a silicon carbide single crystal according to the first embodiment.

Next, the method of manufacturing a silicon carbide single crystal according to the first embodiment which includes the above-described step of determining a time to replace heat insulator 4 is described. As shown in FIG. 7, the method of manufacturing a silicon carbide single crystal according to the first embodiment includes a preparing step (S10), a mass measuring step (S20), a comparing step (S30), a crystal growing step (S40), and a replacing step (S50). The mass measuring step (S20) and the comparing step (S30) implement the above-described step of determining a time to replace heat insulator 4.

[Preparing Step (S10)]

Figure 8:
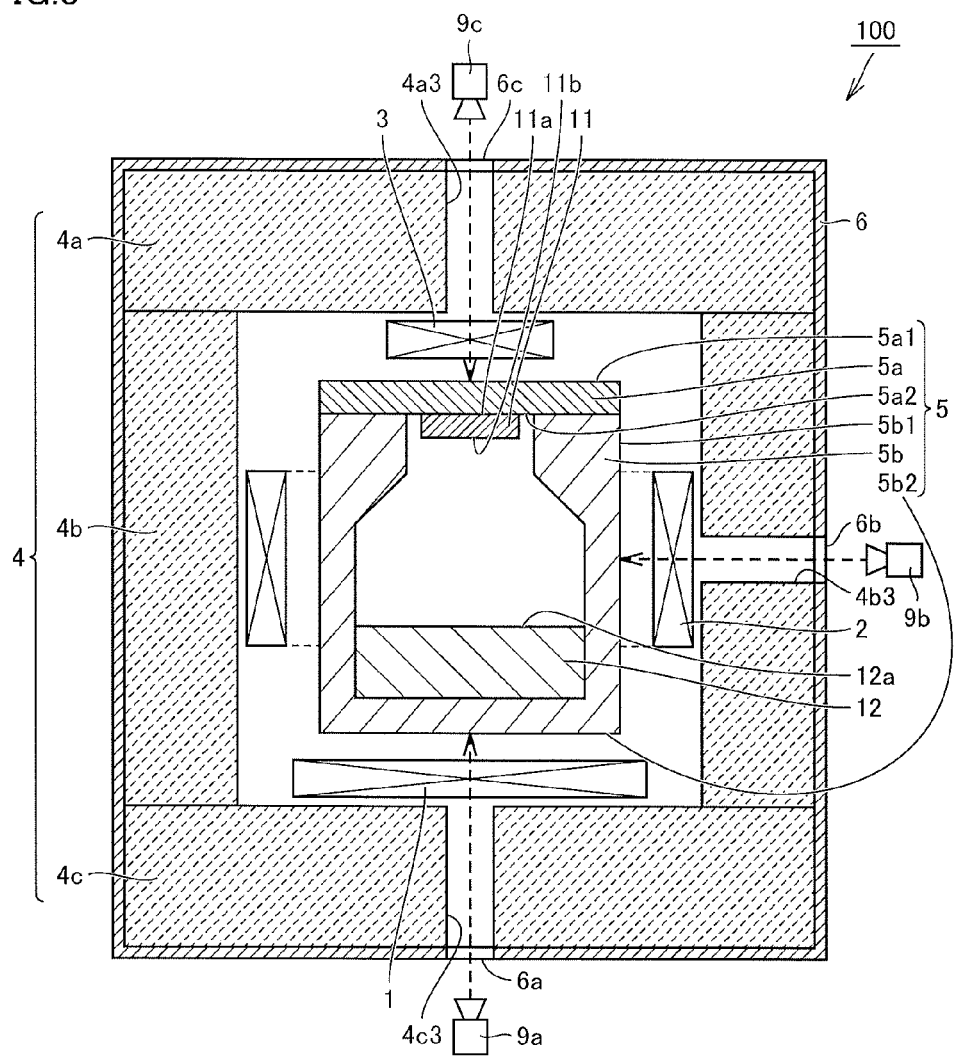
FIG. 8 is a schematic vertical sectional view showing a first step of the method of manufacturing a silicon carbide single crystal according to the first embodiment.

In the preparing step (S10), heat insulator 4, first resistive heater 1, second resistive heater 2, third resistive heater 3, and crucible 5 are prepared. Seed crystal 11 and silicon carbide source material 12 are further prepared. Heat insulator 4 includes first heat insulating unit 4a, second heat insulating unit 4b and third heat insulating unit 4c arranged such that they can be separated from each other. As shown in FIG. 8, silicon carbide source material 12 is placed in accommodation unit 5b of crucible 5. Silicon carbide source material 12 is powders of polycrystalline silicon carbide, for example. Seed crystal 11 is fixed on seed crystal holding surface 5a2 of pedestal 5a with an adhesive, for example. Seed crystal 11 is a substrate of hexagonal silicon carbide having a polytype of 4H, for example. Seed crystal 11 has backside surface 11a fixed to seed crystal holding surface 5a2 of pedestal 5a, and surface 11b opposite to backside surface 11a. Surface 11b has a diameter of 1.00 mm or more, for example, and preferably 150 mm or more. Surface 11b is a plane having an off angle of about 8° or less relative to a {0001} plane, for example. Seed crystal 11 is disposed such that surface 11b faces a surface 12a.

[Mass Measuring Step (S20)]

In the mass measuring step (S20), the mass of at least a portion of heat insulator 4 is measured. Preferably, the at least a portion of heat insulator 4 includes first heat insulating unit 4a. In the first embodiment, for example, the mass of first heat insulating unit 4a is measured.

[Comparing Step (S30)]

In the comparing step (S30), a measured value of the mass obtained in the mass measuring step (S20) is compared with a threshold value. The "threshold value" is set based on a rate of mass increase (for example, 10%) serving as a criterion for a time for replacement in the correlation between the thermal conductivity and the mass of heat insulator 4 shown in FIG. 4. Specifically, the threshold value is set by adding to a measured value of an initial mass of the at least a portion of heat insulator 4 to be measured a value obtained by multiplying the measured value of the initial mass by the criterion (10%). In the first embodiment, for example, the threshold value is predetermined based on the mass of first heat insulating unit 4a measured at a time when heat insulator 4 is new or when the number of crystal growth is low, and in the comparing step (S30), the measured value of the mass of first heat insulating unit 4a is compared with the threshold value.

It is noted that in the comparing step (S30), instead of comparing the measured value of the mass with the threshold value, a rate of mass increase may be calculated from the measured value of the mass based on the above equation (3), and the calculated rate of mass increase may be compared with the criterion (for example, 10%).

When it is determined in the comparing step that the measured value of the mass is lower than the threshold value (or that the rate of mass increase is lower than the criterion) (YES in S30), the crystal growing step (S40: FIG. 7) is performed.

When it is determined in the comparing step that the measured value of the mass is equal to or higher than the threshold value (or that the rate of mass increase is equal to or higher than the criterion) (NO in S30), on the other hand, the replacing step (S50: FIG. 7) is performed. Specifically, heat insulator 4 is replaced with another heat insulator. The "another heat insulator" is a heat insulator whose measured value of mass is lower than the threshold value (or whose rate of mass increase is lower than the criterion), and is, for example, a new heat insulator. After the replacing step (S50), the crystal growing step (S40) is performed.

[Crystal Growing Step (S40)]

In the crystal growing step (S40), heat insulator 4 is first placed in chamber 6, then first resistive heater 1, second resistive heater 2, third resistive heater 3 and crucible 5 are placed in heat insulator 4. In addition, lower radiation thermometer 9a, lateral radiation thermometer 9b and upper radiation thermometer 9c are provided outside chamber 6.

Figure 9:
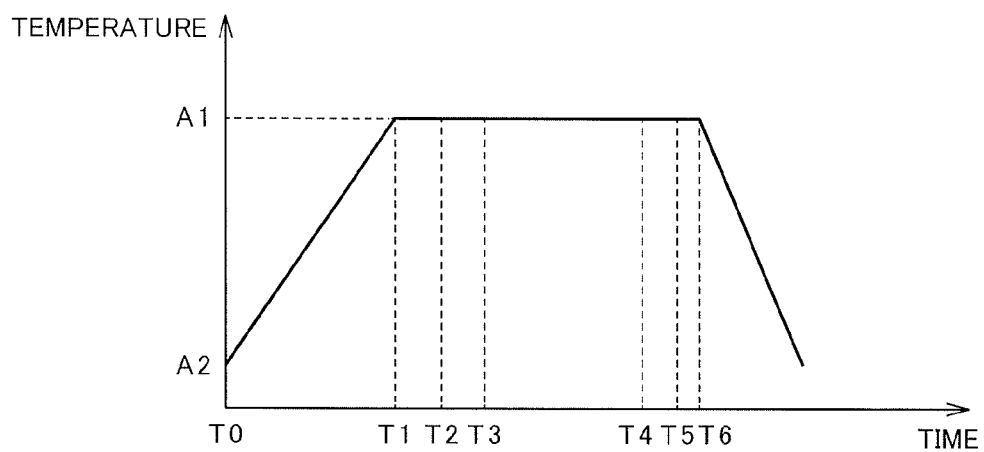
FIG. 9 is a diagram showing relation between temperature of the crucible and time.

Then, crucible 5 is heated with first resistive heater 1, second resistive heater 2 and third resistive heater 3. As shown in FIG. 9, crucible 5 having a temperature A2 at time T0 is heated to a temperature A1 at time T1. Temperature A2 is room temperature, for example. Temperature A1 is 2000° C. or more and 2400° C. or less, for example. Both silicon carbide source material 12 and seed crystal 11 are heated such that the temperature decreases from bottom surface 5b2 toward top surface 5a1. Crucible 5 is maintained at temperature A1 between time T1 and time T6.

Figure 10:
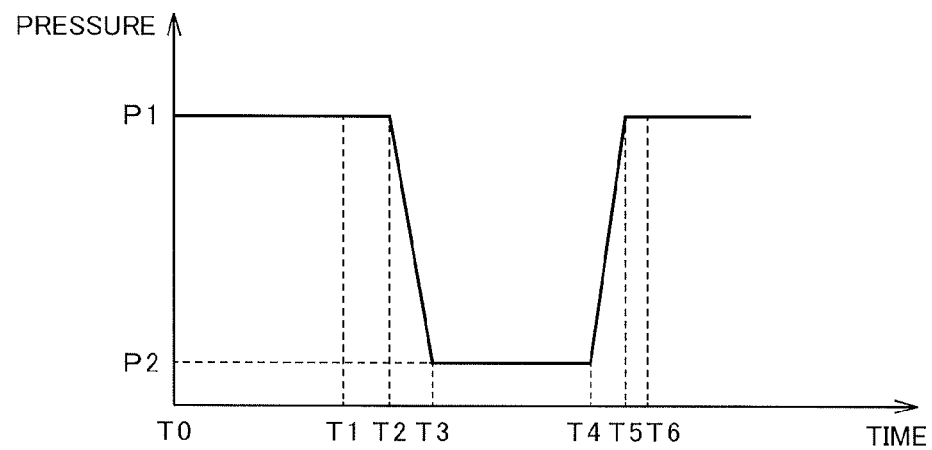
FIG. 10 is a diagram showing relation between pressure in a chamber and time.

As shown in FIG. 10, a pressure P1 is maintained in chamber 6 between time T0 and time T2. Pressure P1 is atmospheric pressure, for example. An atmospheric gas in chamber 6 is inert gas such as argon gas, helium gas or nitrogen gas.

Figure 11:
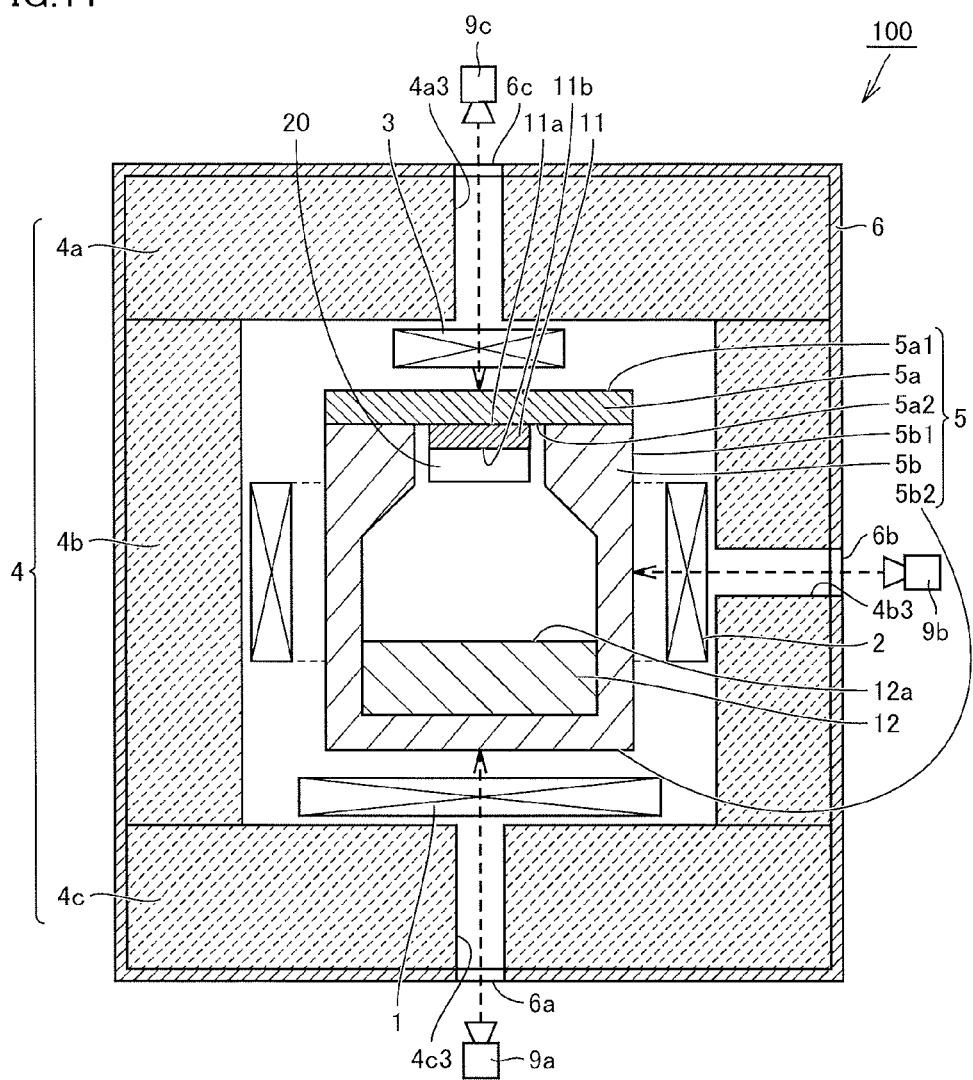
FIG. 11 is a schematic vertical sectional view showing a second step of the method of manufacturing a silicon carbide single crystal according to the first embodiment.

At time T2, the pressure in chamber 6 is lowered from pressure P1 to a pressure P2. Pressure P2 is 0.5 kPa or more and 2 kPa or less, for example. Pressure P2 is maintained in chamber 6 between time T3 and time T4. Silicon carbide source material 12 starts to sublimate between time T2 and time T3. The sublimated silicon carbide is recrystallized on surface 11b of seed crystal 11. Pressure P2 is maintained in chamber 6 between time T3 and time T4. Between time T3 and time T4, silicon carbide source material 12 continues to sublimate, whereby a silicon carbide single crystal 20 (see FIG. 11) is grown on surface 11b of seed crystal 11.

In the above-described crystal growing step, adjustment of the temperature of each of silicon carbide source material 12 and seed crystal 11 is implemented by controlling an amount of heat generated by each of first resistive heater 1, second resistive heater 2 and third resistive heater 3. Specifically, the temperature of bottom surface 5b2 of crucible 5 is measured by lower radiation thermometer 9a. The measured temperature of bottom surface 5b2 is transmitted to a control unit (not shown) of manufacturing apparatus 100. The control unit controls the amount of heat generated by first resistive heater 1 by means of electric power supplied to first resistive heater 1 such that the temperature of bottom surface 5b2 matches a target temperature. Alternatively, the control unit may control the amount of heat generated by first resistive heater 1 based on the temperature of first resistive heater 1 measured by lower radiation thermometer 9a. Still alternatively, the control unit may control the amount of heat generated by first resistive heater 1 based on the temperatures of both first resistive heater 1 and bottom surface 5b2.

Likewise, the temperature of side surface 5b1 of crucible 5 is measured by lateral radiation thermometer 9b. The measured temperature of side surface 5b1 is transmitted to the control unit. The control unit controls the amount of heat generated by second resistive heater 2 by means of electric power supplied to second resistive heater 2 such that the temperature of side surface 5b1 matches a target temperature. Alternatively, the control unit may control the amount of heat generated by second resistive heater 2 based on the temperature of second resistive heater 2 measured by lateral radiation thermometer 9b. Still alternatively, the control unit may control the amount of heat generated by second resistive heater 2 based on the temperatures of both second resistive heater 2 and side surface 5b1.

Likewise, the temperature of top surface 5a1 of crucible 5 is measured by upper radiation thermometer 9c. The measured temperature of top surface 5a1 is transmitted to the control unit. The control unit controls the amount of heat generated by third resistive heater 3 by means of electric power supplied to third resistive heater 3 such that the temperature of top surface 5a1 matches a target temperature. Alternatively, the control unit may control the amount of heat generated by third resistive heater 3 based on the temperature of third resistive heater 3 measured by upper radiation thermometer 9c. Still alternatively, the control unit may control the amount of heat generated by third resistive heater 3 based on the temperatures of both third resistive heater 3 and top surface 5a1.

Then, as shown in FIG. 10, between time T4 and time T5, the pressure in chamber 6 increases from pressure P2 to pressure P1. As the pressure in chamber 6 increases, the sublimation of silicon carbide source material 12 is suppressed. The crystal growing step is thus substantially completed. The heating of crucible 5 is stopped at time T6, and crucible 5 is cooled. After the temperature of crucible 5 approaches the room temperature, silicon carbide single crystal 20 is removed from crucible 5.

(Variations)

Next, variations of the apparatus and method for manufacturing a silicon carbide single crystal according to the first embodiment are described.

<First Variation>

Although the mass measuring step (S20) and the comparing step (S30) are performed each time the silicon carbide single crystal is grown in the method of manufacturing a silicon carbide single crystal shown in FIG. 7, the mass measuring step and the comparing step may be performed at regular time intervals. In other words, when it is determined in the comparing step that the measured value of the mass is lower than the threshold value, the crystal growing step (S40) is performed at least one or more times.

Figure 12:
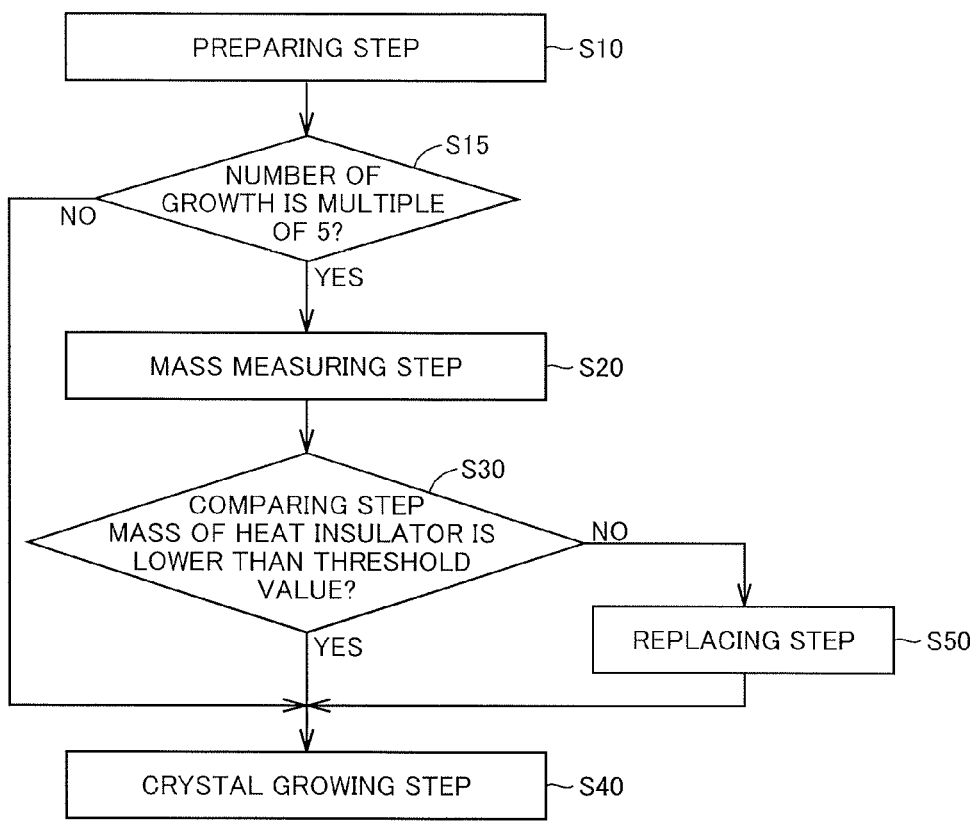
FIG. 12 is a flowchart showing a variation of the method of manufacturing a silicon carbide single crystal according to the first embodiment.

For example, as shown in FIG. 12, after the preparing step (S10) is performed, a step of determining whether the number of the current crystal growth is a multiple of 5 or not (S15) is performed. When the number of crystal growth is a multiple of 5 (YES in S15), the mass measuring step (S20) and the comparing step (S30) are performed. When the number of crystal growth is not a multiple of 5 (NO in S15), on the other hand, the mass measuring step (S20) and the comparing step (S30) are skipped and the crystal growing step (S40) is performed.

It is noted that the regular time interval which defines the timing of performing the mass measuring step and the comparing step may be set to a fixed value, or may be set to a variable value varying with the number of crystal growth or the like. For example, a relatively long time interval may be set at a stage when the number of crystal growth is small and a degree of degradation of heat insulator 4 is low, whereas a relatively short time interval may be set at a stage when the number of crystal growth has increased and the degradation of heat insulator 4 has progressed.

<Second Variation>

Figure 13:
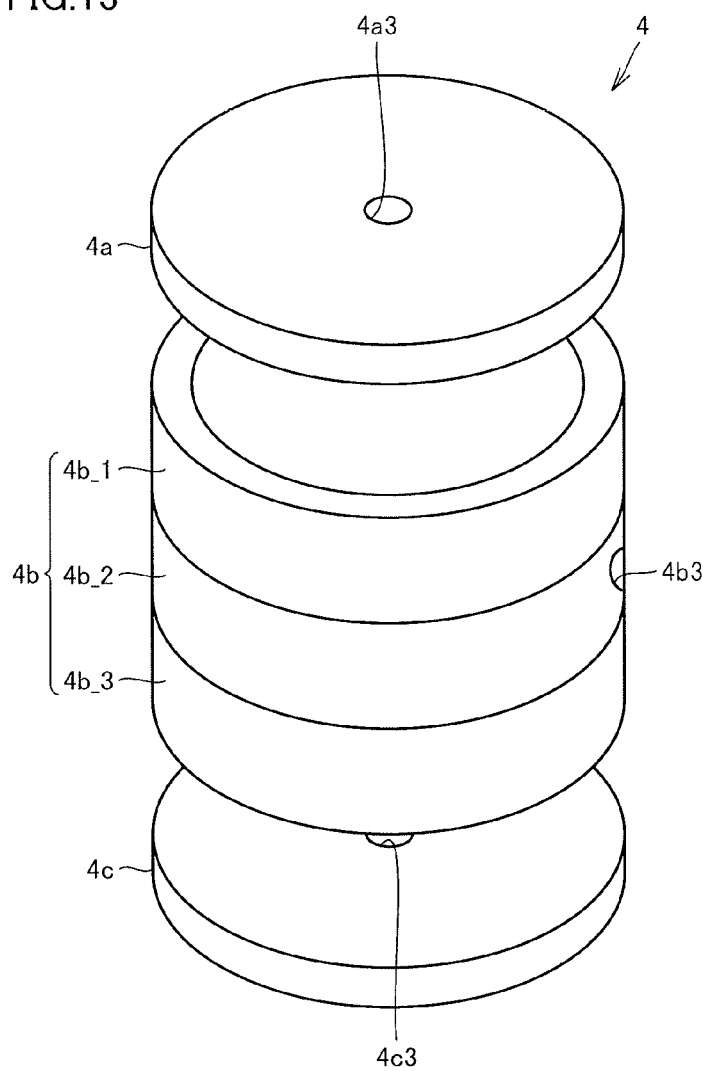
FIG. 13 is a schematic perspective view showing the configuration of a heat insulator in a variation of the apparatus of manufacturing a silicon carbide single crystal according to the first embodiment.

Although the first embodiment has described an example where heat insulator 4 is formed of three heat insulating units 4a to 4c, heat insulator 4 can be subdivided to facilitate the handling of heat insulator 4 and expand the scope of selection of a portion for mass measurement. FIG. 13 shows an example where second heat insulating unit 4b is formed of a plurality of heat insulating portions 4b_1, 4b_2 and 4b_3 provided between first heat insulating unit 4a and third heat insulating unit 4c and arranged such that they can be separated from each other.

With such a configuration, for example, in the mass measuring step (S20: FIG. 7), the mass of heat insulating portion 4b_1 directly connected to first heat insulating unit 4a can be measured along with the mass of first heat insulating unit 4a. Heat insulating portion 4b_1, which is disposed close to top surface 5a1 of crucible 5, is a portion where recrystallization of silicon carbide tends to be occur after first heat insulating unit 4a. Accordingly, a time to replace heat insulator 4 can be accurately determined also by measuring the masses of first heat insulating unit 4a and heat insulating portion 4b_1.

Alternatively, in the comparing step (S30: FIG. 7), the measured value of the mass of first heat insulating unit 4a may be compared with a first threshold value and the measured value of the mass of heat insulating portion 4b_1 may be compared with a second threshold value, and the crystal growing step (S40: FIG. 7) may be performed based on the two comparison results. Specifically, when it is determined in the comparing step that the measured value of the mass of first heat insulating unit 4a is lower than the first threshold value and that the measured value of the mass of heat insulating portion 4b_1 is lower than the second threshold value, the crystal growing step is performed. By determining a time for replacement based on the plurality of comparison results in this manner, the accuracy of determining a time for replacement can be improved.

<Third Variation>

Figure 14:
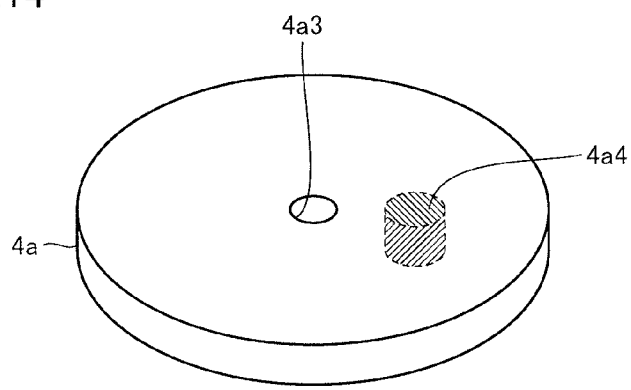
FIG. 14 is a schematic perspective view showing the configuration of a heat insulating unit in the variation of the apparatus of manufacturing a silicon carbide single crystal according to the first embodiment.

In the mass measuring step (S20: FIG. 7), a portion may be removed from one of first heat insulating unit 4a, second heat insulating unit 4b and third heat insulating unit 4c, and the mass of this portion may be measured. For example, as shown in FIG. 14, first heat insulating unit 4a may be provided with a removable portion 4a4, and portion 4a4 may be removed and the mass of this portion may be measured in the mass measuring step. Even if the heat insulating units increase in size resulting in difficulty in handling of the heat insulating units, for example, the mass measuring step can be readily performed by employing the configuration shown in FIG. 14.

Since first heat insulating unit 4a has a higher rate of mass increase relative to the number of crystal growth than second heat insulating unit 4b and third heat insulating unit 4c, as shown in FIG. 6, it is preferable to remove portion 4a4 of first heat insulating unit 4a (FIG. 14) and measure the mass of this portion in the mass measuring step. When measuring the mass of a portion of second heat insulating unit 4b, it is preferable to remove a portion located toward top surface 5a1 of crucible 5.

Second Embodiment

Figure 15:
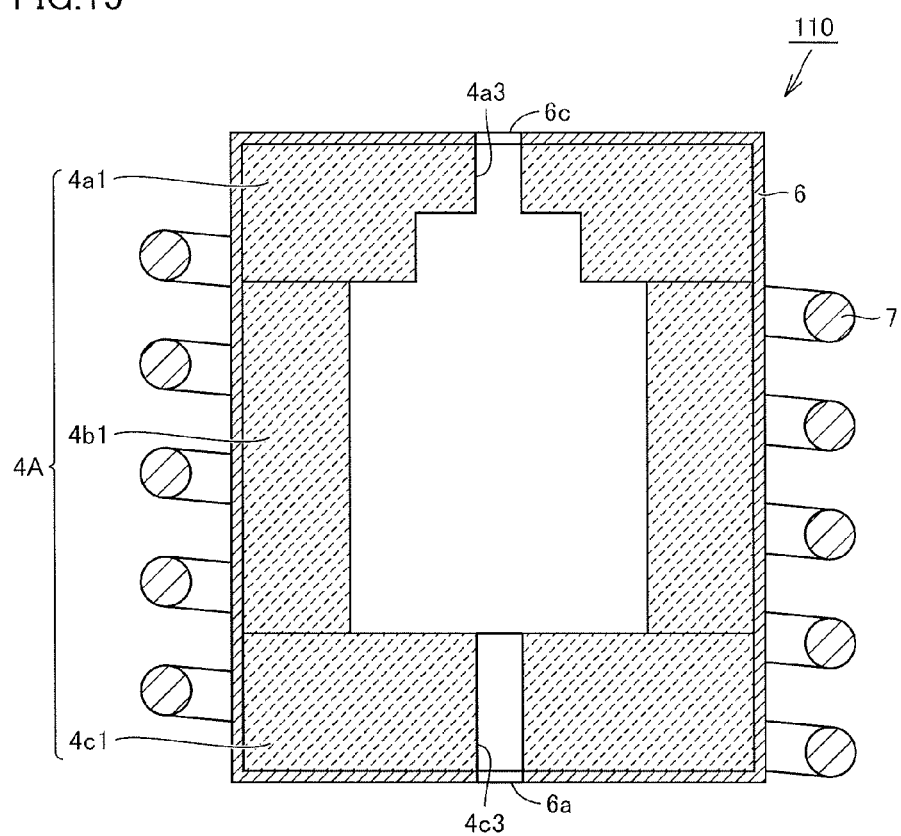
FIG. 15 is a schematic vertical sectional view showing the configuration of an apparatus of manufacturing a silicon carbide single crystal according to a second embodiment.
Figure 16:
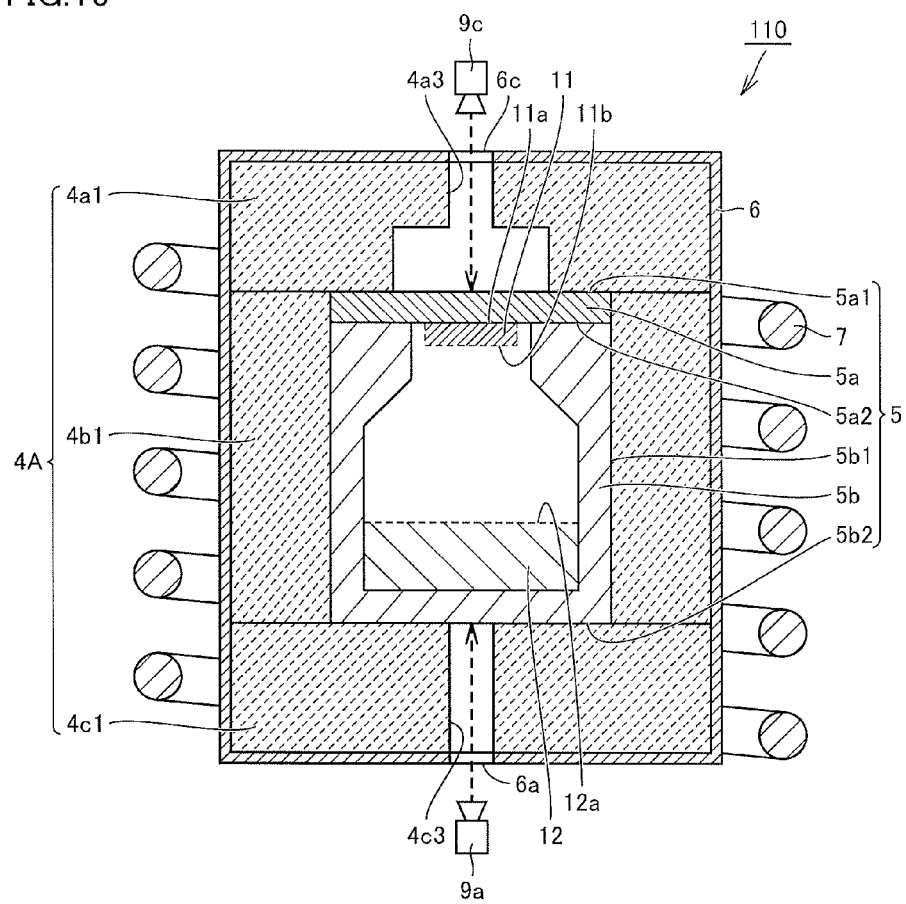
FIG. 16 is a schematic vertical sectional view showing the configuration of the apparatus of manufacturing a silicon carbide single crystal according to the second embodiment, with a crucible and radiation thermometers disposed.

As shown in FIGS. 15 and 16, an apparatus 110 of manufacturing a silicon carbide single crystal according to a second embodiment basically has the same configuration as that of manufacturing apparatus 100 according to the first embodiment (FIGS. 1 and 2). Manufacturing apparatus 110 is different from manufacturing apparatus 100, however, in that it includes a high-frequency heating coil 7 instead of first resistive heater 1, second resistive heater 2 and third resistive heater 3, as the heater for heating crucible 5, and that it includes a heat insulator 4A instead of heat insulator 4. Thus, the same or corresponding parts are designated by the same signs and the same description will not be repeated.

As shown in FIG. 15, if high-frequency heating coil 7 is used for the heater, high-frequency heating coil 7 is preferably disposed outside heat insulator 4A. It is noted that high-frequency heating coil 7 may be disposed outside chamber 6, or may be disposed between heat insulator 4A and chamber 6.

High-frequency heating coil 7 is configured to be able to adjust each of the temperature of top surface 5a1 and the temperature of bottom surface 5b2. For this purpose, high-frequency heating coil 7 may be configured such that it can be displaced in a vertical direction of crucible 5 (which corresponds to an up-down direction in FIG. 15). Alternatively, high-frequency heating coil 7 may include a plurality of portions that generate heat in amounts that can be controlled independently of one another.

Heat insulator 4A is configured to be able to accommodate crucible 5. Heat insulator 4A is made of the same material as that of heat insulator 4. As shown in FIG. 16, heat insulator 4A is provided to surround the circumference of crucible 5 when crucible 5 is placed in chamber 6.

Heat insulator 4A includes a first heat insulating unit 4a1, a second heat insulating unit 4b1, and a third heat insulating unit 4c1. First to third heat insulating units 4a1, 4b1 and 4c1 can be separated from each other. First heat insulating unit 4a1 is provided to cover top surface 5a1. Second heat insulating unit 4b1 is provided to cover side surface 5b1. Third heat insulating unit 4c1 is provided to cover bottom surface 5b2. Second heat insulating unit 4b has a cylindrical shape, for example.

First heat insulating unit 4a1 is provided with opening 4a3 such that top surface 5a1 is partially exposed through first heat insulating unit 4a1. Chamber 6 is provided with opening 6c in communication with opening 4a3. An opening diameter of opening 4a3 toward top surface 5a1 is greater than an opening diameter of opening 4a3 toward chamber 6. Thus, a gap is formed between an inner surface of first heat insulating unit 4a1 and top surface 5a1. When heat is released toward this gap from top surface 5a1, the temperature of top surface 5a1 is maintained at a temperature slightly lower than the temperature of bottom surface 5b2. This temperature difference contributes to forming a temperature gradient required for sublimation between seed crystal 11 disposed toward top surface 5a1 and silicon carbide source material 12 disposed toward bottom surface 5b2.

Third heat insulating unit 4c1 is provided with opening 4c3 such that bottom surface 5b2 is partially exposed through third heat insulating unit 4c1. Chamber 6 is provided with opening 6a in communication with opening 4c3.

As shown in FIG. 16, lower radiation thermometer 9a is provided outside chamber 6 in a position facing bottom surface 5b2, and configured to be able to measure the temperature of bottom surface 5b2 through opening 4c3 and opening 6a. Upper radiation thermometer 9c is provided outside chamber 6 in a position facing top surface 5a1, and configured to be able to measure the temperature of top surface 5a1 through opening 4a3 and opening 6c.

A method of manufacturing a silicon carbide single crystal according to the second embodiment is basically the same as the method of manufacturing a silicon carbide single crystal according to the first embodiment (see FIG. 7). That is, the method of manufacturing a silicon carbide single crystal according to the second embodiment includes the preparing step (S10: FIG. 7), the mass measuring step (S20: FIG. 7), the comparing step (S30: FIG. 7), the crystal growing step (S40: FIG. 7), and the replacing step (S50: FIG. 7). The mass measuring step (S20) and the comparing step (S30) implement the step of determining a time to replace heat insulator 4.

The method of manufacturing a silicon carbide single crystal according to the second embodiment is different from the method of manufacturing a silicon carbide single crystal according to the first embodiment in how to adjust the temperatures of silicon carbide source material 12 and seed crystal 11 in the crystal growing step (S40). Specifically, in the crystal growing step (S40), the adjustment of the temperature of each of silicon carbide source material 12 and seed crystal 11 is implemented by controlling an amount of heat generated by high-frequency heating coil 7. The temperature of bottom surface 5b2 measured by lower radiation thermometer 9a and the temperature of top surface 5a1 measured by upper radiation thermometer 9c are transmitted to the control unit (not shown). The control unit controls the amount of heat generated by high-frequency heating coil 7 by means of electric power supplied to high-frequency heating coil 7 such that the temperature of top surface 5a1 matches a target temperature. The control unit further adjusts the position of high-frequency heating coil 7 in the vertical direction such that a temperature gradient required for sublimation is formed between top surface 5a1 and bottom surface 5b2. Alternatively, if high-frequency heating coil 7 includes a plurality of portions, the control unit controls amounts of heat generated by the plurality of portions independently of each other by means of electric power supplied to the portions such that the above temperature gradient is formed.

Next, a function and effect of the apparatus and method for manufacturing a silicon carbide single crystal according to the present embodiment will be described.

The method of manufacturing a silicon carbide single crystal according to the present embodiment includes the steps of preparing crucible 5 having top surface 5a1, bottom surface 5b2 opposite to top surface 5a1, and tubular side surface 5b1 located between top surface 5a1 and bottom surface 5b2, source material 12 disposed toward bottom surface 5b2 in crucible 5, seed crystal 11 disposed to face source material 12 toward top surface 5b1 in crucible 5, the heater (resistive heaters 1 to 3 or high-frequency heating coil 7) for heating crucible 5, and heat insulator 4 configured to be able to accommodate crucible 5 therein (S10: FIG. 7), measuring the mass of at least a portion of heat insulator 4 (S20: FIG. 7), comparing a measured value of the mass obtained in the measuring step with the threshold value (S30: FIG. 7), and growing silicon carbide single crystal 20 on seed crystal 11 by sublimation of source material 12 by heating crucible 5 placed in heat insulator 4 with the heater (S40: FIG. 7). When the measured value of the mass is lower than the threshold value in the comparing step, the step of growing silicon carbide single crystal 20 is performed at least one or more times. By employing such a configuration where the mass of heat insulator 4 is measured and a time to replace heat insulator 4 is determined based on a measurement value of the mass, a criterion for a time for replacement can be uniquely determined, thus allowing accurate determination of the time for replacement.

The method of manufacturing a silicon carbide single crystal of the present embodiment further includes, when the measured value of the mass is equal to or higher than the threshold value in the comparing step (S30), the step of replacing heat insulator 4 with another heat insulator whose measured value of mass is lower than the threshold value (S50: FIG. 7). After the replacing step, the step of growing silicon carbide single crystal 20 (S40) is performed.

Further, according to the method of manufacturing a silicon carbide single crystal of the present embodiment, heat insulator 4 includes first heat insulating unit 4a provided to cover top surface 5a1, second heat insulating unit 4b provided to cover side surface 5b1 and third heat insulating unit 4c provided to cover bottom surface 5b2, first to third heat insulating units 4a to 4c being separable from each other. In the measuring step (S20: FIG. 7), the at least a portion of heat insulator 4 includes first heat insulating unit 4a. Thus, even if heat insulator 4 increases in size and weight as crucible 5 has a larger diameter, a portion of heat insulator 4 can be removed and the mass of the portion can be measured. Further, first heat insulating unit 4a, which has a temperature at which recrystallization of silicon carbide tends to be occur as compared to second heat insulating unit 4b and third heat insulating unit 4c, is a portion where the mass increases significantly relative to increase in the number of times of crystal growth. By measuring the mass of first heat insulating unit 4a where degradation manifests itself most conspicuously, a degraded state of heat insulator 4 can be more accurately detected, whereby the accuracy of determining a time for replacement can be improved.

Further, according to the method of manufacturing a silicon carbide single crystal of the present embodiment, second heat insulating unit 4b includes the plurality of heat insulating portions 4b_1 to 4b_3 provided between first heat insulating unit 4a and third heat insulating unit 4c and arranged such that they can be separated from each other. In the measuring step (S20: FIG. 7), the at least a portion of heat insulator 4 further includes heat insulating portion 4b_1 directly connected to first heat insulating unit 4a. By subdividing second heat insulating unit 4b in this manner, heat insulator 4 can be more readily handled and the scope of selection of a portion for mass measurement can be expanded. Further, since heat insulating portion 4b_1 connected to first heat insulating unit 4a is a portion where recrystallization of silicon carbide tends to be occur after first heat insulating unit 4a, a time for replacement can be accurately determined also by measuring the masses of first heat insulating unit 4a and heat insulating portion 4b_1.

Further, according to the method of manufacturing a silicon carbide single crystal of the present embodiment, heat insulator 4 includes first heat insulating unit 4a provided to cover top surface 5a1, second heat insulating unit 4b provided to cover side surface 5b1 and third heat insulating unit 4c provided to cover bottom surface 5b2, first to third heat insulating units 4a to 4c being separable from each other. In the measuring step (S20: FIG. 7), the mass of a portion removed from one of first heat insulating unit 4a, second heat insulating unit 4b and third heat insulating unit 4c is measured. Thus, even if heat insulating units 4a to 4c increase in size resulting in difficulty in handling of the heat insulating units, a portion of one of the heat insulating units can be removed and the mass of the portion can be measured. Considering the accuracy of determining a time for replacement, it is preferable to measure the mass of a portion removed from first heat insulating unit 4a where recrystallization of silicon carbide tends to be occur. When measuring the weight of a portion of second heat insulating unit 4b, it is preferable to remove a portion located toward top surface 5a1 of crucible 5.

Apparatus 100 (or 110) of manufacturing a silicon carbide single crystal according to the present embodiment includes heat insulator 4 (or 4A) configured to be able to accommodate crucible 5 therein, the heater (resistive heaters 1 to 3 or high-frequency heating coil 7) provided inside or outside heat insulator 4 (or 4A) so as to surround the circumference of crucible 5, and chamber 6 configured to be able to accommodate at least heat insulator 4. Crucible 5 has top surface 5a1, bottom surface 5b2 opposite to top surface 5a1, and tubular side surface 5b1 located between top surface 5a1 and bottom surface 5b2. Heat insulator 4 (or 4A) includes first heat insulating unit 4a (or 4a1) provided to cover top surface 5a1, second heat insulating unit 4b (or 4b1) provided to cover side surface 5b1, and third heat insulating unit 4c (or 4c1) provided to cover bottom surface 5b2, first to third heat insulating units 4a to 4c (or 4a1 to 4c1) being separable from each other. Thus, even if heat insulator 4, 4A increases in size and weight as crucible 5 has a larger diameter, heat insulator 4, 4A can be readily handled. By removing a portion of heat insulator 4, 4A and measuring the mass of the portion, therefore, a degraded state of heat insulator 4, 4A can be detected to determine a time for replacement.

According to apparatus 100 of manufacturing a silicon carbide single crystal of the present embodiment, second heat insulating unit 4b includes the plurality of heat insulating portions 4b_1 to 4b_3 connecting first heat insulating unit 4a to third heat insulating unit 4c and arranged such that they can be separated from each other. By subdividing second heat insulating unit 4b in this manner, heat insulator 4 can be more readily handled and the scope of selection of a portion for mass measurement can be expanded.

It should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A method of manufacturing a silicon carbide single crystal, comprising steps of:
   preparing
      a crucible having a top surface, a bottom surface opposite to said top surface, and a tubular side surface located between said top surface and said bottom surface,
      a source material disposed toward said bottom surface in said crucible,
      a seed crystal disposed to face said source material toward said top surface in said crucible,
      a heater for heating said crucible, and
      a heat insulator configured to be able to accommodate said crucible therein;
   measuring a mass of at least a portion of said heat insulator;
   comparing a measured value of said mass obtained in said measuring step with a threshold value that is derived from a correlation between rate of increase of thermal conductivity and rate of increase of mass of said heat insulator; and
   growing a silicon carbide single crystal on said seed crystal by sublimation of said source material by heating said crucible placed in said heat insulator with said heater,
   when said measured value of said mass is lower than said threshold value in said comparing step, said step of growing a silicon carbide single crystal being performed at least one or more times.

2. The method of manufacturing a silicon carbide single crystal according to claim 1, further comprising a step of, when said measured value of said mass is equal to or higher than said threshold value in said comparing step, replacing said heat insulator with another heat insulator whose measured value of mass is lower than said threshold value, wherein
   after said replacing step, said step of growing a silicon carbide single crystal is performed.

3. The method of manufacturing a silicon carbide single crystal according to claim 2, wherein
   said heat insulator includes a first heat insulating unit provided to cover said top surface, a second heat insulating unit provided to cover said side surface, and a third heat insulating unit provided to cover said bottom surface, said first to third heat insulating units being separable from each other, and
   in said measuring step, said at least a portion of said heat insulator includes said first heat insulating unit.

4. The method of manufacturing a silicon carbide single crystal according to claim 3, wherein
   said second heat insulating unit includes a plurality of heat insulating portions provided between said first heat insulating unit and said third heat insulating unit and arranged such that they can be separated from each other, and in said measuring step, said at least a portion of said heat insulator further includes one of said heat insulating portions directly connected to said first heat insulating unit.

5. The method of manufacturing a silicon carbide single crystal according to claim 2, wherein
said heat insulator includes a first heat insulating unit provided to cover said top surface, a second heat insulating unit provided to cover said side surface, and a third heat insulating unit provided to cover said bottom surface, said first to third heat insulating units being separable from each other, and
in said measuring step, a mass of a portion removed from one of said first heat insulating unit, said second heat insulating unit and said third heat insulating unit is measured.

6. The method of manufacturing a silicon carbide single crystal according to claim 1, wherein
said heat insulator includes a first heat insulating unit provided to cover said top surface, a second heat insulating unit provided to cover said side surface, and a third heat insulating unit provided to cover said bottom surface, said first to third heat insulating units being separable from each other, and
in said measuring step, said at least a portion of said heat insulator includes said first heat insulating unit.

7. The method of manufacturing a silicon carbide single crystal according to claim 6, wherein
said second heat insulating unit includes a plurality of heat insulating portions provided between said first heat insulating unit and said third heat insulating unit and arranged such that they can be separated from each other, and
in said measuring step, said at least a portion of said heat insulator further includes one of said heat insulating portions directly connected to said first heat insulating unit.

8. The method of manufacturing a silicon carbide single crystal according to claim 1, wherein
said heat insulator includes a first heat insulating unit provided to cover said top surface, a second heat insulating unit provided to cover said side surface, and a third heat insulating unit provided to cover said bottom surface, said first to third heat insulating units being separable from each other, and
in said measuring step, a mass of a portion removed from one of said first heat insulating unit, said second heat insulating unit and said third heat insulating unit is measured.

* * * * *